(12) United States Patent
Ghai et al.

(10) Patent No.: US 9,711,227 B1
(45) Date of Patent: Jul. 18, 2017

(54) NON-VOLATILE MEMORY WITH IN FIELD FAILURE PREDICTION USING LEAKAGE DETECTION

(71) Applicant: SANDISK TECHNOLOGIES INC., Plano, TX (US)

(72) Inventors: Ashish Ghai, San Jose, CA (US); Yuvaraj Krishnamoorthy, San Jose, CA (US); Ekamdeep Singh, San Jose, CA (US); Kalpana Vakati, Fremont, CA (US); Maythin Uthayopas, San Jose, CA (US); Mark Shlick, Ganey-Tikva (IL); Srikar Peesari, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/141,507

(22) Filed: Apr. 28, 2016

(51) Int. Cl.
| | | |
|---|---|---|
| G11C 11/34 | (2006.01) | |
| G11C 16/04 | (2006.01) | |
| G11C 16/14 | (2006.01) | |
| G11C 16/10 | (2006.01) | |
| G06F 11/10 | (2006.01) | |
| G06F 3/06 | (2006.01) | |
| G11C 29/52 | (2006.01) | |

(52) U.S. Cl.
CPC ............ *G11C 16/14* (2013.01); *G06F 3/0619* (2013.01); *G06F 3/0688* (2013.01); *G06F 11/1072* (2013.01); *G11C 16/10* (2013.01); *G11C 29/52* (2013.01)

(58) Field of Classification Search
CPC ......... G11C 16/14; G11C 16/10; G11C 29/52; G06F 11/1072; G06F 3/0688; G06F 3/0619
See application file for complete search history.

(56) References Cited

U.S. PATENT DOCUMENTS

| | | | |
|---|---|---|---|
| 4,860,261 | A | 8/1989 | Kreifels |
| 5,428,621 | A | 6/1995 | Mehrotra |
| 5,465,233 | A | 11/1995 | Slemmer |
| 6,108,241 | A | 8/2000 | Chevallier |
| 6,111,799 | A | 8/2000 | Uchida |
| 6,307,778 | B1 | 10/2001 | Micheloni |
| 6,584,019 | B1 | 6/2003 | Chevallier |
| 6,781,902 | B2 | 8/2004 | Oumiya |
| 6,813,183 | B2 | 11/2004 | Chevallier |
| 7,257,038 | B2 | 8/2007 | Killian |
| 7,440,347 | B1 | 10/2008 | Vogelsang |
| 7,965,577 | B2 | 6/2011 | Chen |
| 8,305,807 | B2 | 11/2012 | Shah |
| 8,379,454 | B2 | 2/2013 | Kochar |
| 8,432,732 | B2 | 4/2013 | Li |

(Continued)

OTHER PUBLICATIONS

Paudel, et al., "Word Line Look Ahead Read for Word Line to Word Line Short Detection," U.S. Appl. No. 14/919,472, filed Oct. 21, 2015.

(Continued)

*Primary Examiner* — Toan Le
(74) *Attorney, Agent, or Firm* — Vierra Magen Marcus LLP

(57) ABSTRACT

To prevent data loss due to latent defects, a non-volatile memory system will use a leakage detection circuit to test for small amounts of leakage that indicate that the memory is susceptible to failure.

20 Claims, 14 Drawing Sheets

(56) References Cited

U.S. PATENT DOCUMENTS

| | | | |
|---|---|---|---|
| 8,630,118 | B2 | 1/2014 | Sakai |
| 8,693,254 | B2 | 4/2014 | Hashimoto |
| 8,730,722 | B2 | 5/2014 | Koh |
| 8,775,901 | B2 | 7/2014 | Sharon |
| 8,902,657 | B2 | 12/2014 | Iwai |
| 8,964,480 | B2 | 2/2015 | Mui |
| 9,009,568 | B2 | 4/2015 | Luo |
| 9,026,757 | B2 | 5/2015 | Li |
| 9,065,481 | B2 | 6/2015 | Meaney |
| 9,135,989 | B2 | 9/2015 | Sakai |
| 9,443,610 | B1 * | 9/2016 | Pan ................. G11C 29/025 |
| 2009/0094482 | A1 | 4/2009 | Zilberman |
| 2011/0063918 | A1 | 3/2011 | Pei |
| 2011/0096601 | A1 | 4/2011 | Gavens |
| 2011/0099418 | A1 | 4/2011 | Chen |
| 2011/0099460 | A1 | 4/2011 | Dusija |
| 2012/0008384 | A1 | 1/2012 | Li |
| 2012/0008410 | A1 | 1/2012 | Huynh |
| 2012/0281479 | A1 * | 11/2012 | Kochar ............. G11C 16/3459 365/185.19 |
| 2013/0028021 | A1 * | 1/2013 | Sharon ................ G11C 11/5642 365/185.17 |
| 2013/0128665 | A1 | 5/2013 | Mokhlesi |
| 2014/0269071 | A1 | 9/2014 | Pandya |
| 2015/0006976 | A1 | 1/2015 | Jeon |
| 2015/0085575 | A1 | 3/2015 | Tam |
| 2015/0301885 | A1 | 10/2015 | Yuan |
| 2016/0232985 | A1 * | 8/2016 | Sabde ................... G11C 29/50 |
| 2016/0267980 | A1 * | 9/2016 | Akamine ........... G11C 16/0483 |
| 2016/0351247 | A1 * | 12/2016 | Vyavahare .......... G11C 11/4093 |
| 2016/0351274 | A1 * | 12/2016 | Pan ....................... G11C 29/50 |

OTHER PUBLICATIONS

Shah, et al., "Non-Volatile Storage System With Defect Detetction and Early Programming Termination," U.S. Appl. No. 14/967,157, filed Dec. 11, 2015.

Tseng, "Error Detection Method," U.S. Appl. No. 14/525,813, filed Oct. 28, 2014.

* cited by examiner

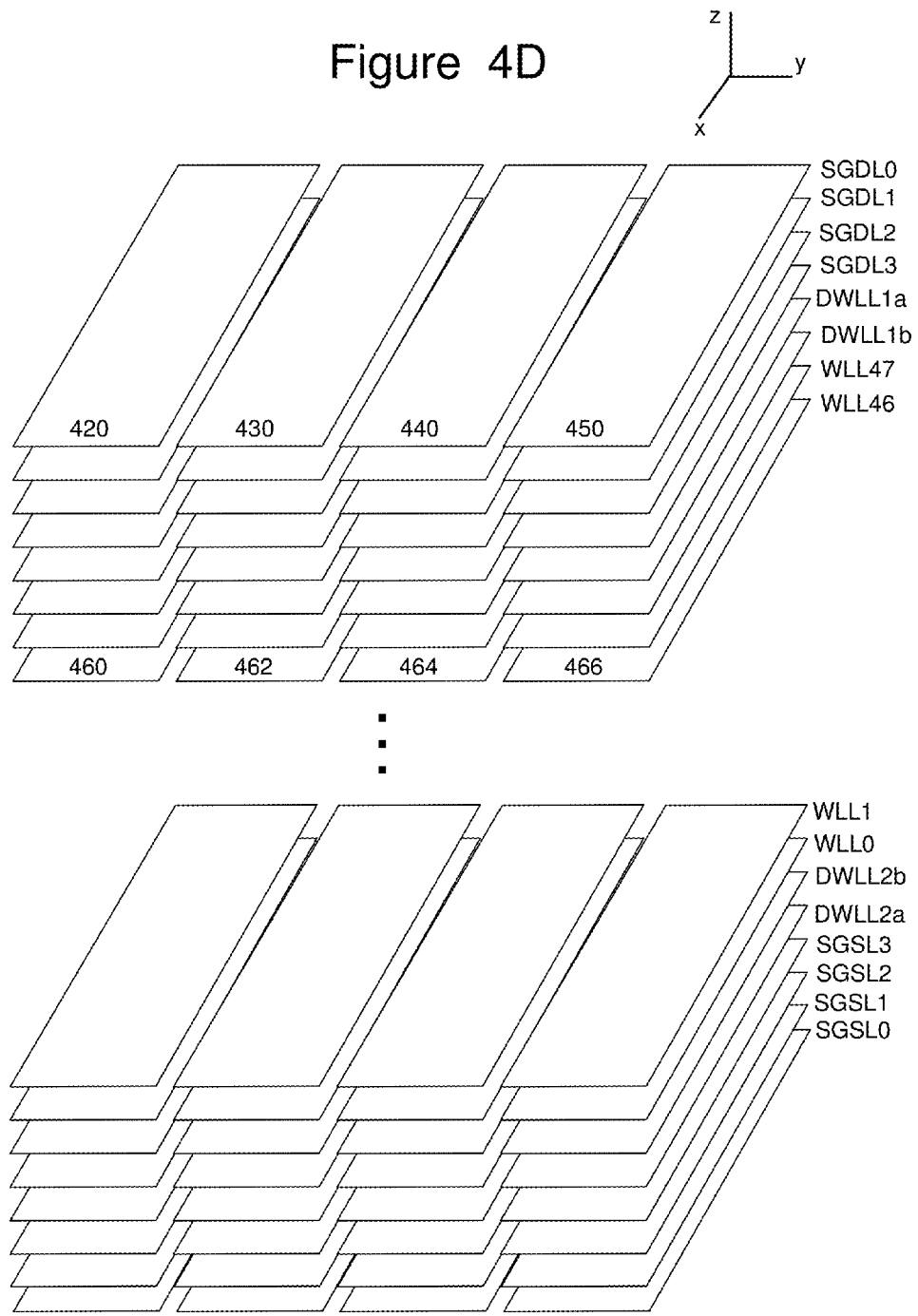

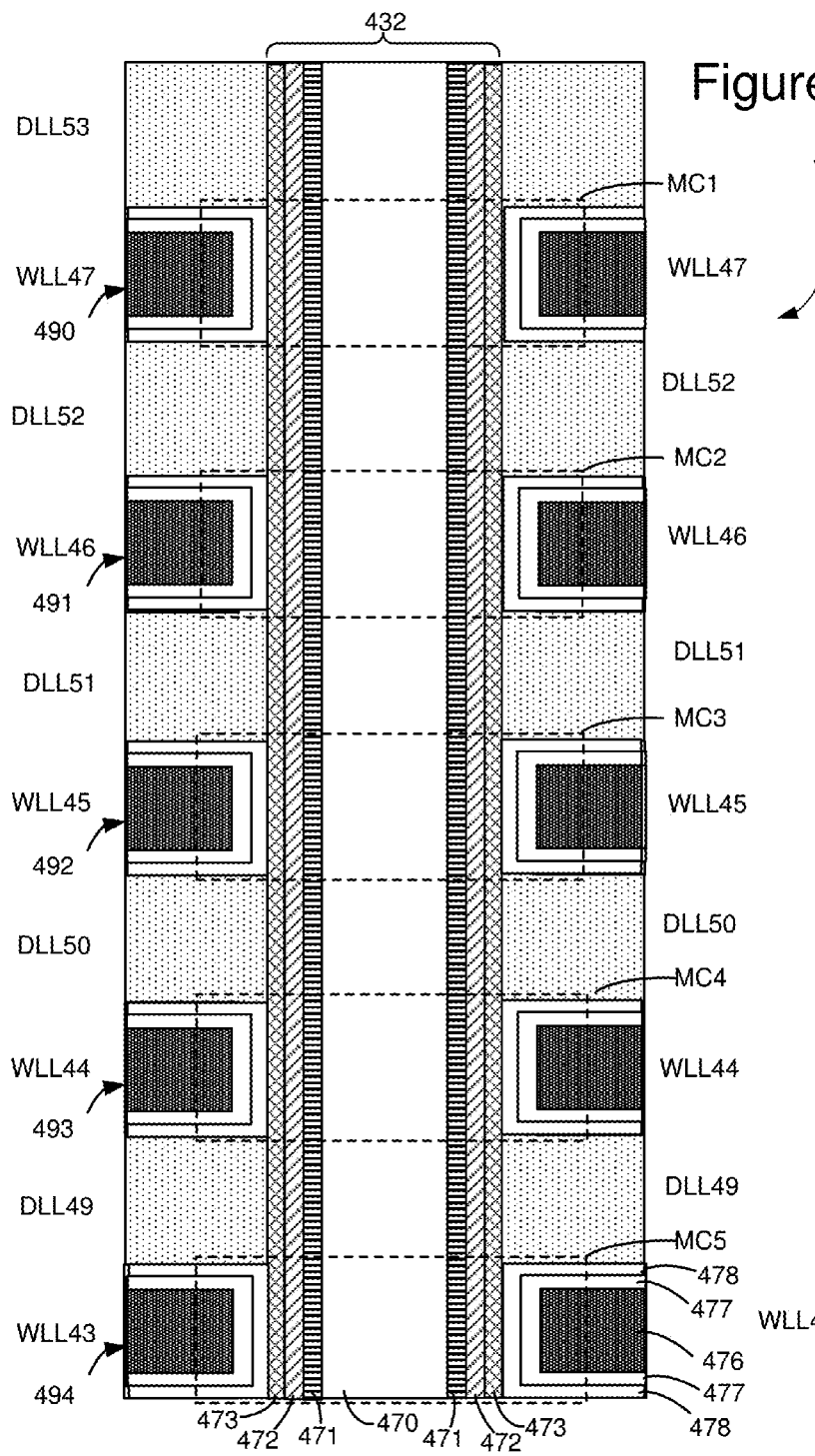

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

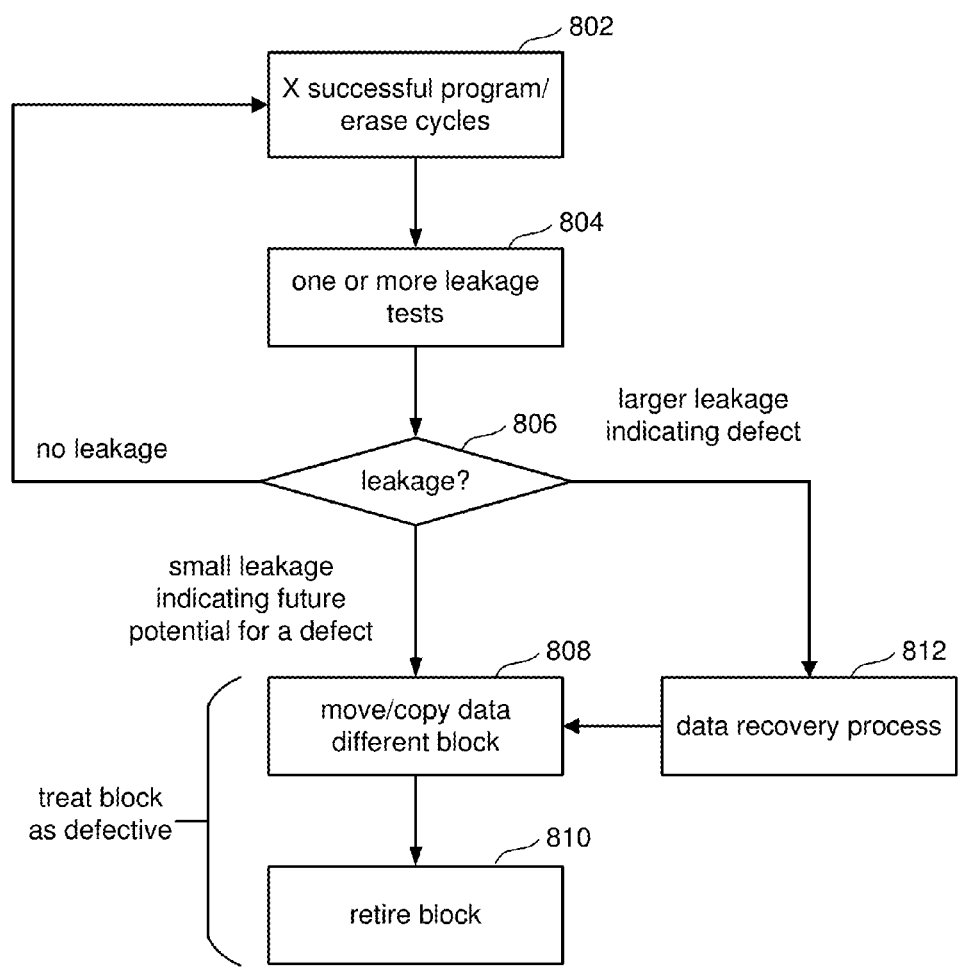

US 9,711,227 B1

NON-VOLATILE MEMORY WITH IN FIELD FAILURE PREDICTION USING LEAKAGE DETECTION

BACKGROUND

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Consumers of semiconductor memory have seen significant advantages as a result of a history of steadily scaling down the physical dimensions of the components of the memory systems. For example, smaller memory cells can be packed more densely on a given die area, allowing the user to access more memory capacity for the same price. However, scaling the sizes of memory cells entails certain risks. In order to achieve the advantage of higher memory capacity for a fixed die size, these smaller memory cells must be packed more closely together. Doing so, however, may result in a greater number of manufacturing defects, such as shorting between adjacent word lines, shorting between word lines and interconnects, shorting between word lines and the substrate, broken word lines, etc. Such defects often result in corruption of data stored on the word lines being programmed and nearby word lines. In some cases, these defects are not realized during tests conducted by manufacturers prior to packaging and shipping. Rather, these defects only manifest themselves after the memory systems has been used from some time and, therefore, only begin to corrupt data after programming and erasing is performed by the user.

Some prior systems have sought to combat latent manufacturing defects by reading programmed data after programming. However, by the time programming has completed, the programming process may have already damaged data being stored in other nearby memory cells.

BRIEF DESCRIPTION OF THE DRAWINGS

Like-numbered elements refer to common components in the different figures.

FIG. 4D depicts a view of the select gate layers and word line layers.

FIG. 4E is a cross sectional view of a vertical column of memory cells.

FIG. 7 is a is a flow chart describing one embodiment of a process for performing in field failure prediction using leakage detection.

DETAILED DESCRIPTION

To prevent data loss due to latent defects, a non-volatile memory system will use a leakage detection circuit to test for small amounts of leakage that indicate that the memory is susceptible to failure. The portions of the memory that appear to be susceptible to failure can be taken out of service, with any data stored therein being moved to elsewhere in the memory system. Thus, the system predicts defects before they happen in order to prevent data loss rather than react to a defect after data may have been compromised.

The following discussion provides details of one example of a suitable structure for memory devices that can used with the proposed technology. Other structures can also be used to implement the proposed technology.

Figure 1:
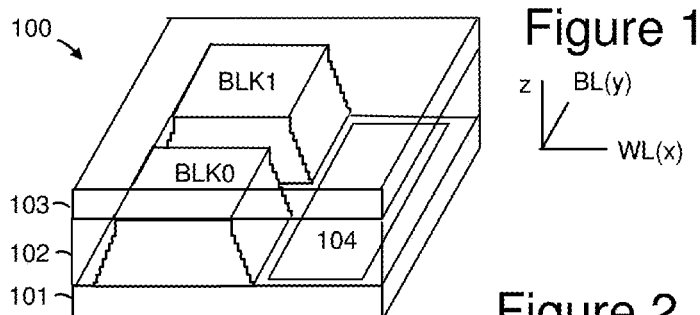
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
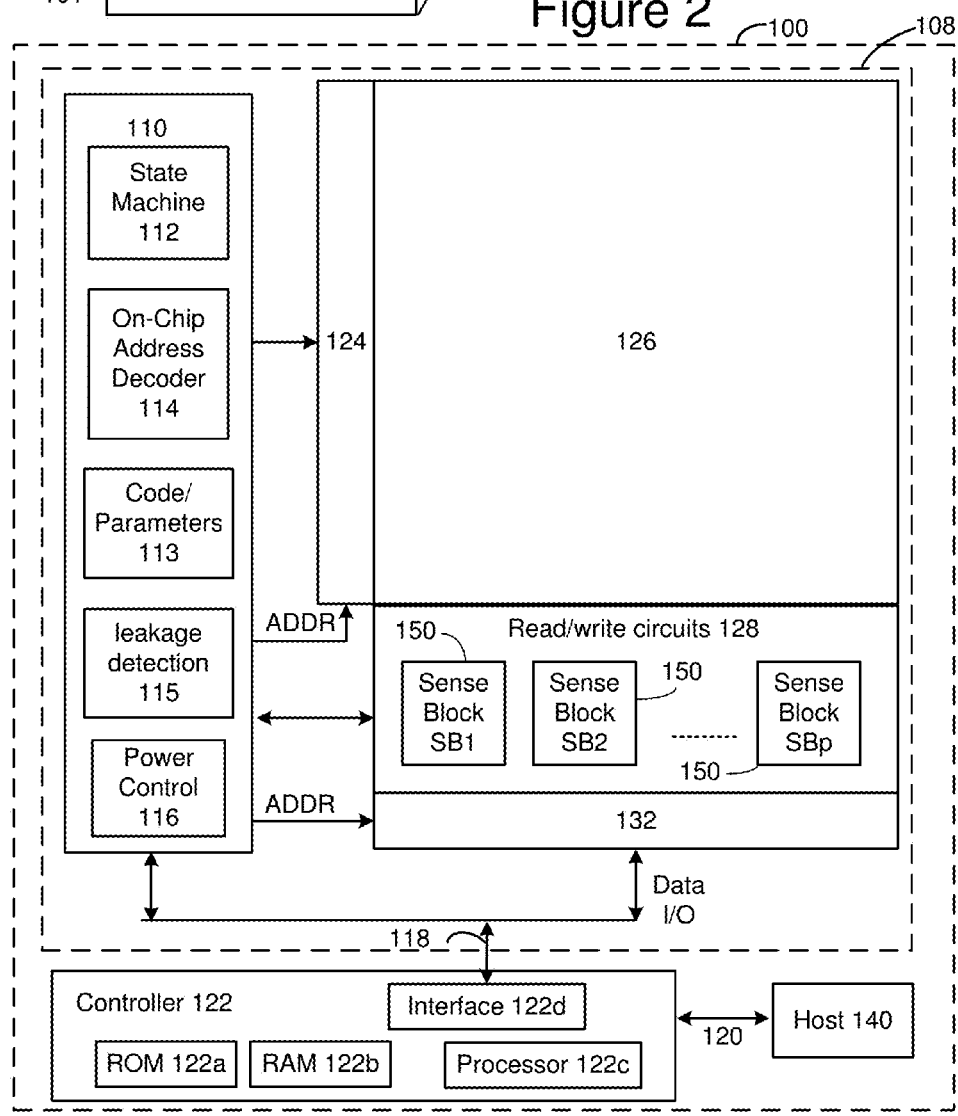
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 is an integrated circuit that includes a three dimensional memory structure 126 of memory cells, word lines and bit lines (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the controller can be separated from the memory die 108. In some embodiments the Controller will be on a different die than the memory die. In other embodiments, a Controller can be on the same die (or same integrated circuit) as the memory. In some embodiments, one Controller 122 will communicate with multiple memory die 108. In other embodiments, each memory die 108 has its own controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, leakage detection circuit 115 and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Leakage detection circuit 115 is a circuit that detects one or more types of leakage including word line to word line leakage, word line to substrate leakage, word line to memory hole leakage, word line to local interconnect leakage, etc. Leakage detection circuit 115 can be any suitable leakage detection circuit known in the art. Some prior art leakage detection circuits that are suitable for the system of FIG. 2 make use of a current mirror and reference current to monitor current as an indicator of leakage; however, other types of leakage detection circuits known in the art can be used. The technology described herein is not limited to any specific type of leakage detection circuit. In many cases, the leakage detection circuits are used for testing during the manufacturing stage. Peripheral circuits or the memory structure 126 can be tested for leakage when connected to the remaining portions of the system or when isolated. In some embodiments, the memory die will be sent commands to enable the leakage detection circuit to perform a test for leakage. Some embodiments will include separate circuits for testing for different types of leakage, while other embodiments will include on circuit for testing for multiple types of leakage.

Any one or any combination of control circuitry 110, state machine 112, decoders 114/124/132, code and parameter storage 113, power control module 116, sense blocks 150, read/write circuits 128, and Controller 122 can be considered a control circuit that performs the functions described herein.

The (on-chip or off-chip) Controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
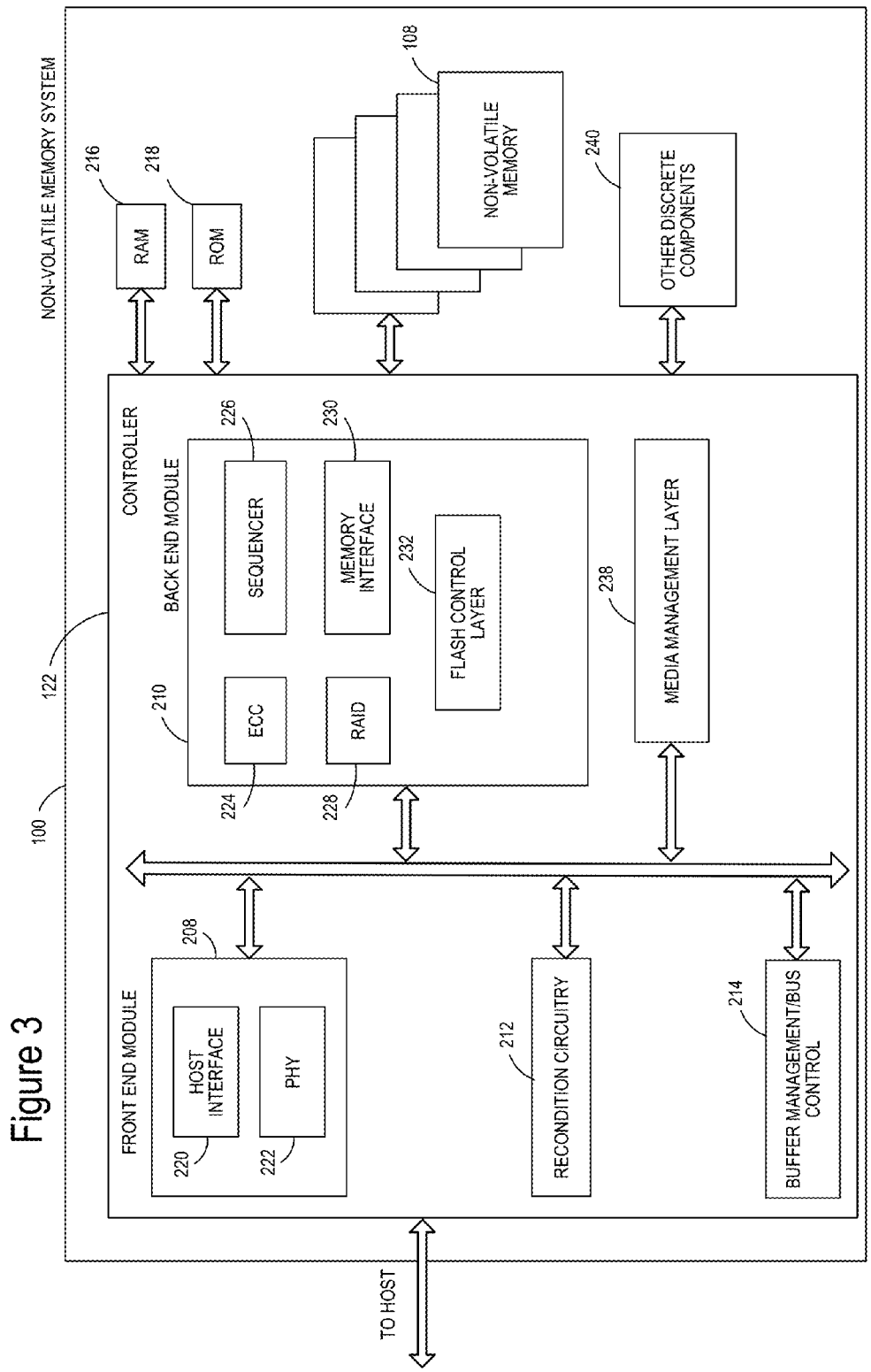
FIG. 3 is a block diagram depicting one embodiment of a controller.

FIG. 3 is a block diagram of example memory system 100, depicting more details of Controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, Controller 122 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the Controller 122 and outside the controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4:
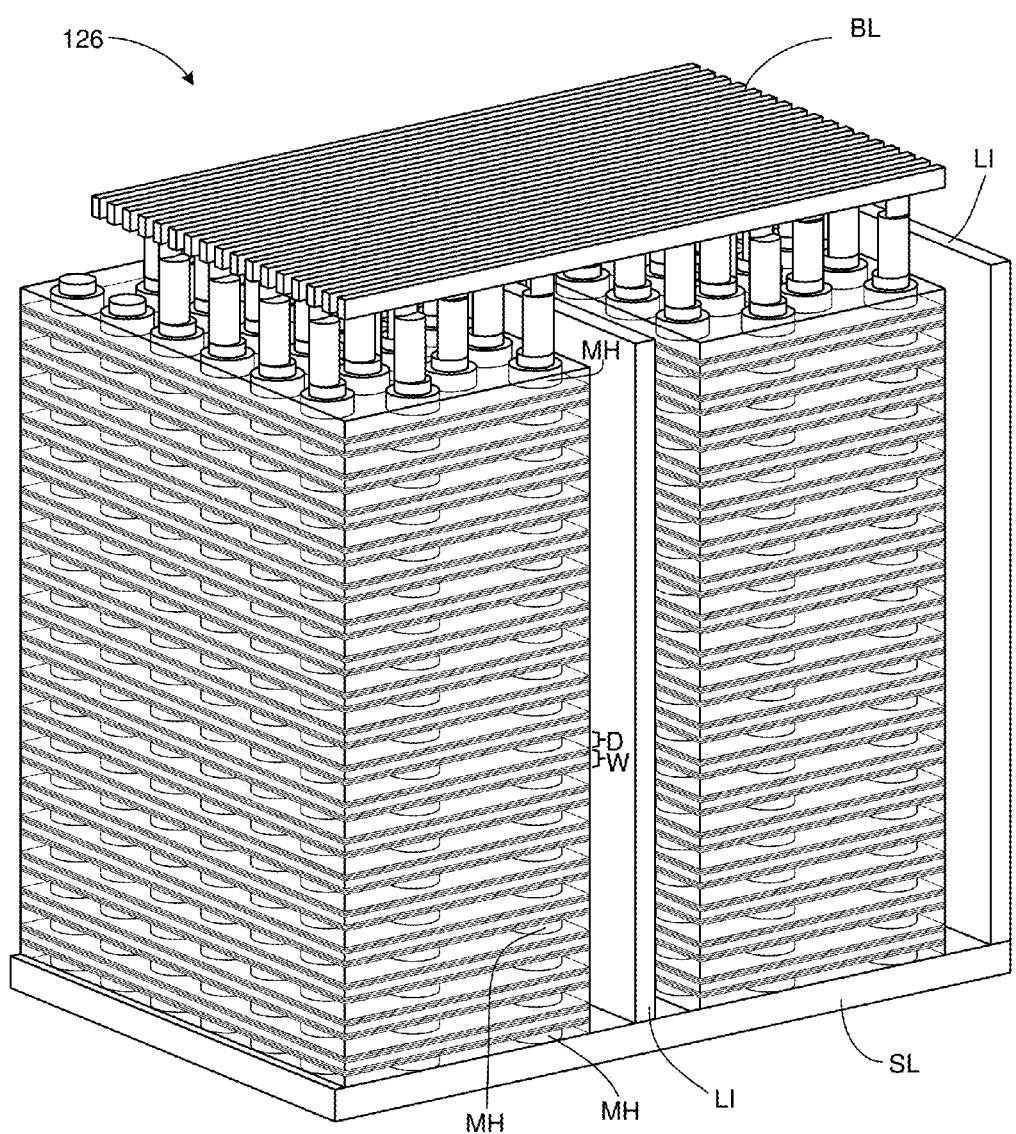
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4G.

Figure 4A:
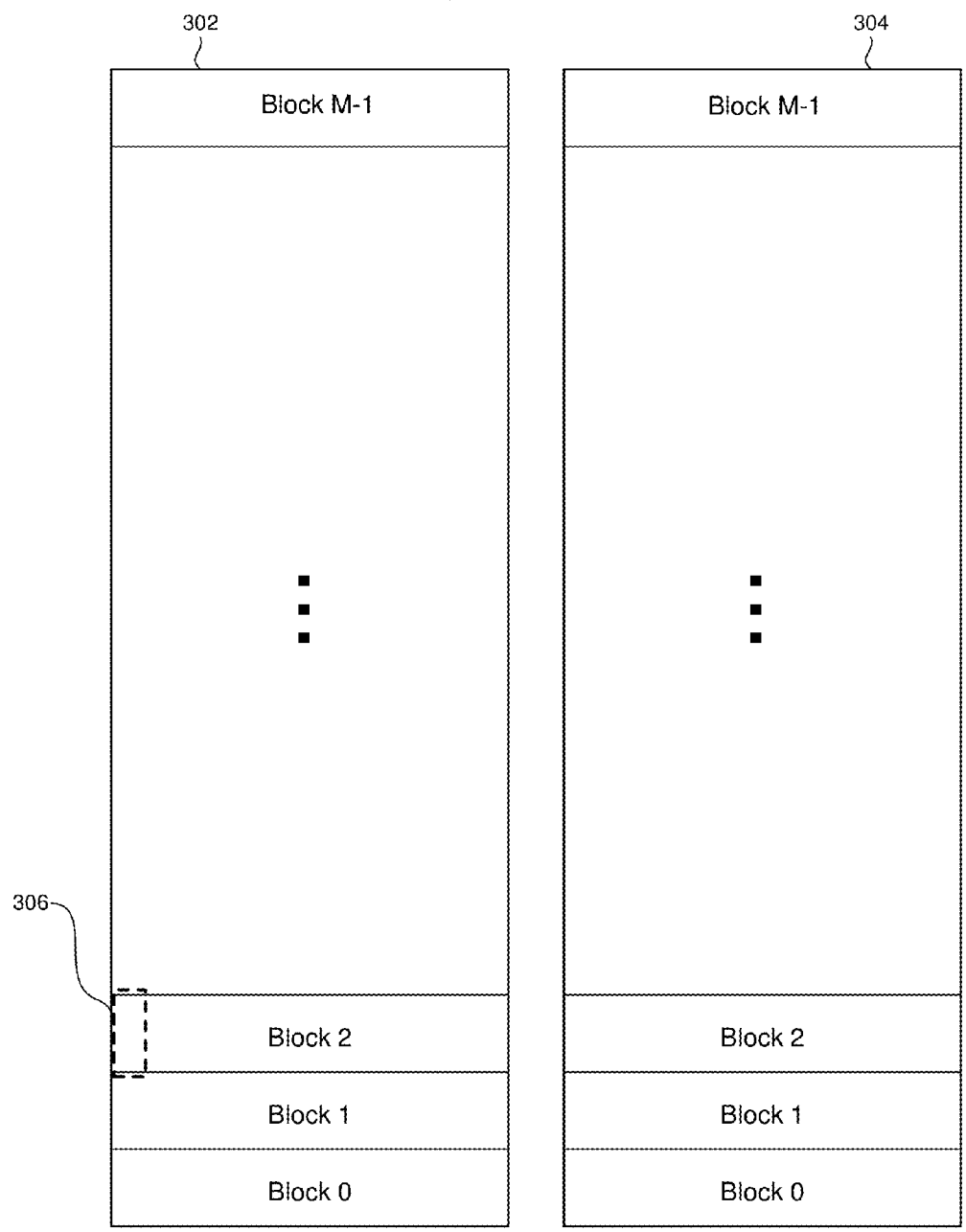
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
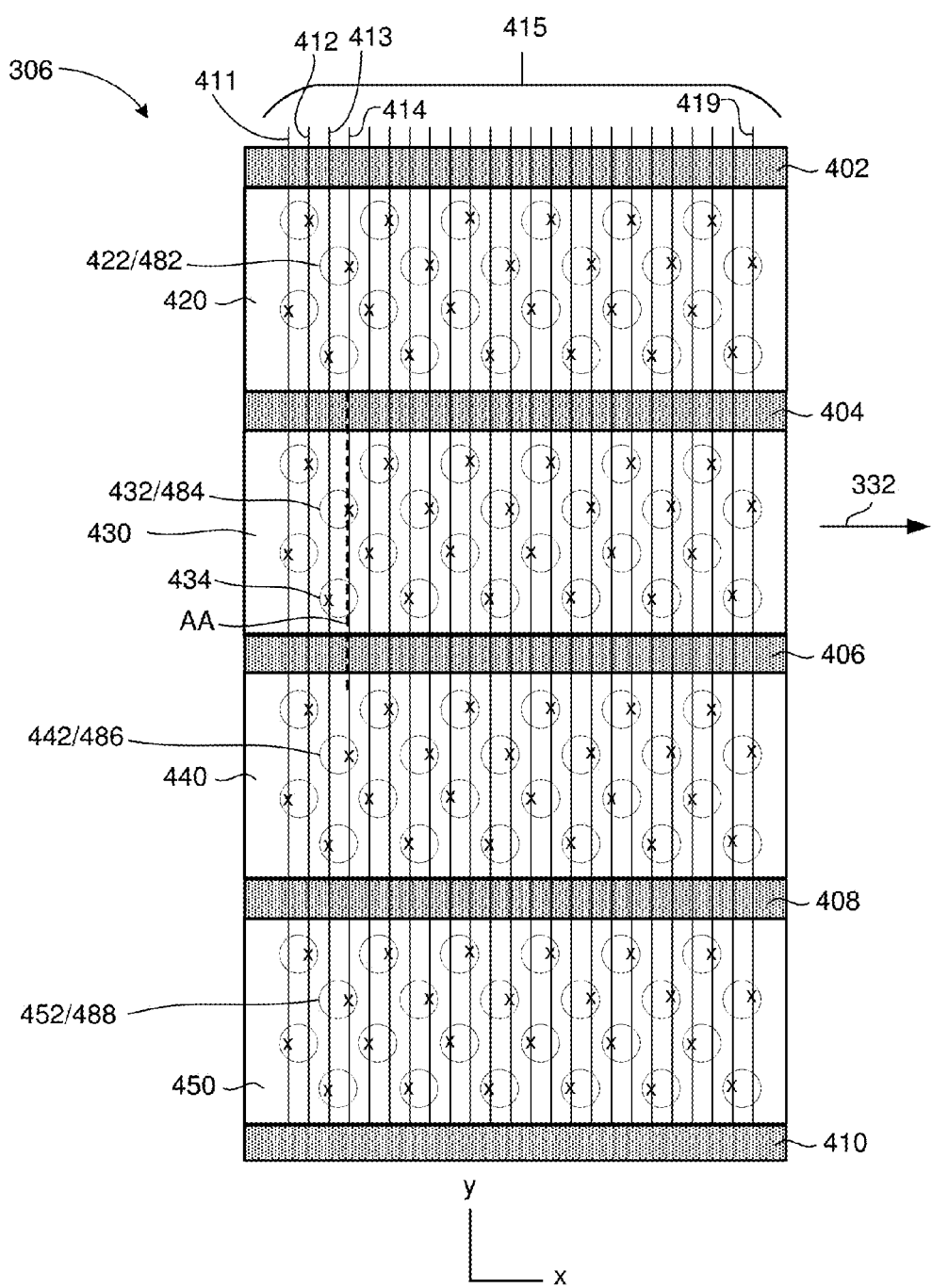
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns.

Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
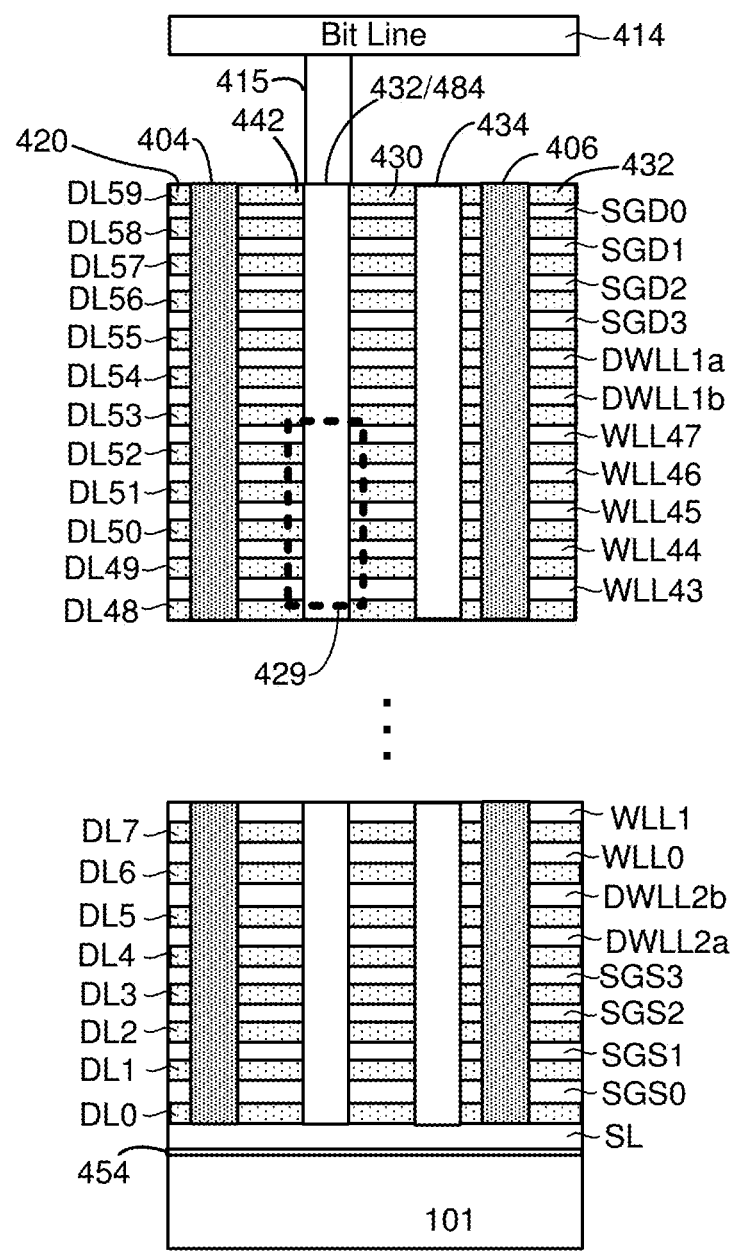
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5A:
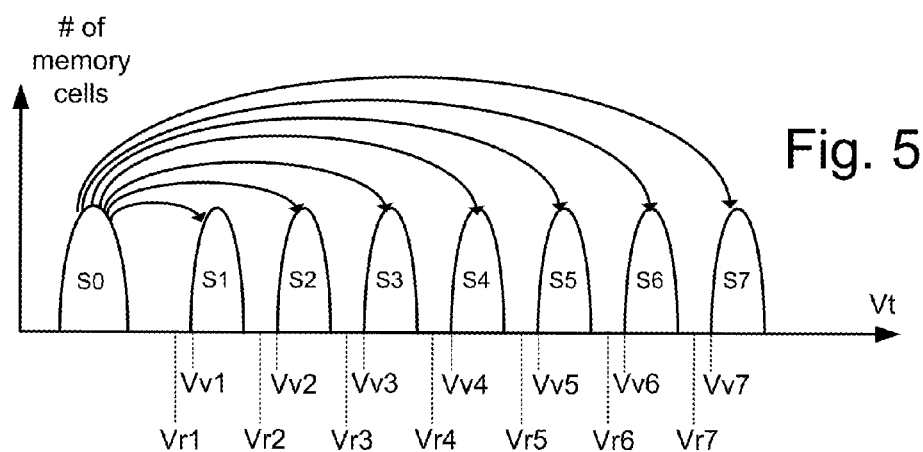
FIG. 5 depicts threshold voltage distributions.
FIG. 5A is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0=111. S1=110, S2=200, S3=000, S4=010, S5=011, S6=001 and S7=101. Other encodings of data can also be used. No particular data encoding is required by the technology disclosed herein.

Figure 6A:
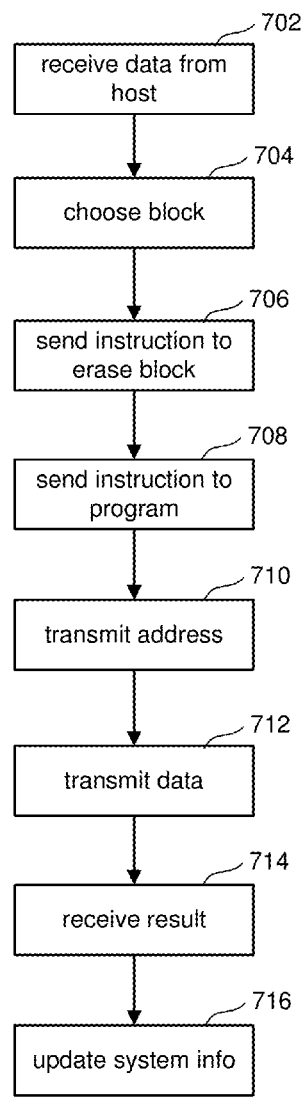
FIG. 6A is a flow chart describing one embodiment of a process for programming.

FIG. 6A is a flowchart describing one embodiment of a process for programming that is performed by Controller 122. In some embodiments, rather than have a dedicated Controller, the host can perform the functions of the controller.

In step 702, Controller 122 receives data from a host. This data can be referred to as host data as it is provided by the host, rather than being system data (log files, etc) generated by the Controller. The host is the device for which the memory system is embedded in or otherwise connected to. Examples of hosts include computers, smartphones, appliances, audio/visual devices, etc. Step 702 may also include Controller 122 receiving instructions from the host to program the host data. In response, Controller 122 runs the ECC engine to create code words from the host data. These code words are the data that will be transmitted to the memory, as described below. Controller 122 can also scramble the data to achieve wear leveling with respect to the memory cells. In step 704, Controller 122 chooses a block in the memory structure 126 to store the host data. In one embodiment, Controller 122 maintains a list of blocks that are available for programming and a list of blocks that are bad (e.g., due to defects). In step 706, Controller 122 sends an instruction to the memory die to erase the chosen block so that the block will be prepared for programming.

In step 708 of FIG. 6A, Controller 122 sends instructions to one or more memory die 108 to program data. In step 710, Controller 122 sends one or more logical addresses to one or more memory die 108. The one or more logical addresses indicate where to program the data. In step 712, Controller 122 sends the data to be programmed to the one or more memory die 108. In step 714, Controller 122 receives a result of the programming from the one or more memory die 108. Example results include that the data was programmed successfully or an indication that the programming operation failed. Other embodiments can also include other results. In step 716, in response to the result received in step 714, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

A program/erase cycle is the combination of erasing a block and programming that same block (in either order). Over the life a memory system, each block may experience many program/erase cycles. As the process of FIG. 6A includes erasing a block and programming that same block, it depicts one example of program/erase cycle. FIG. 6A describes the operations of Controller 122; however, the program/erase cycles are experienced by the blocks of memory cells in memory structure 126 on the one or more memory dies.

Figure 6B:
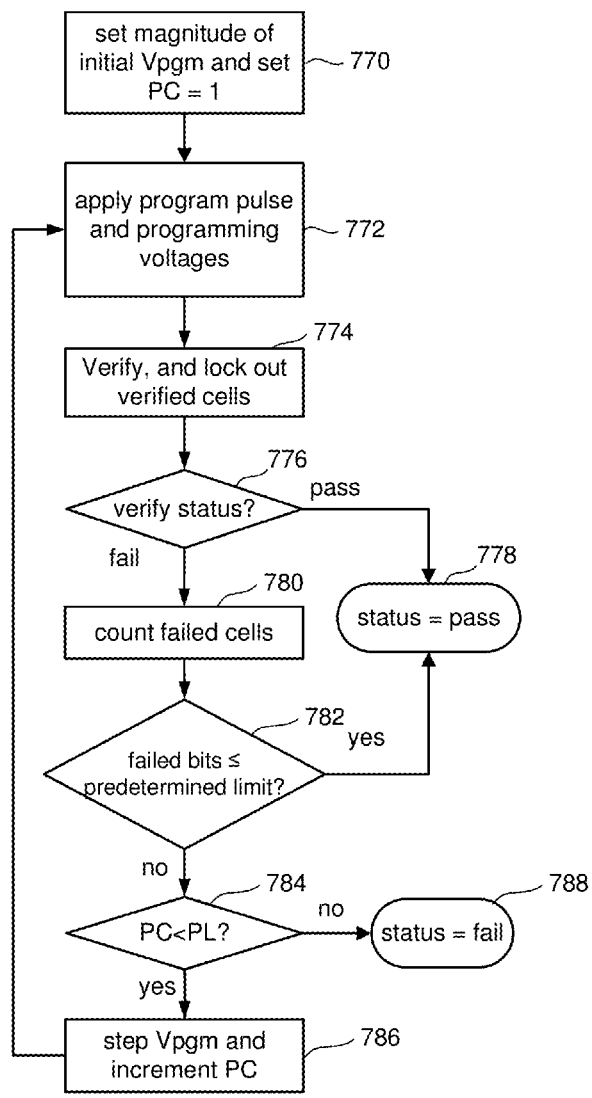
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778.

If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller receives user data, also referred to as information bits, that is to be stored non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile storage 128 by programming one or more memory cells to one or more programming states, which corresponds to v.

As discussed above, some prior memory systems combat latent manufacturing defects by reading back programmed data after programming to see if there are any problems. However, by the time programming has completed, the programming process may have already corrupted data being stored in other nearby memory cells. To prevent data loss due to latent defects, it is proposed to use a leakage detection circuit 115 (see FIG. 2) to test for small amounts of leakage that indicate that the memory is susceptible to failure. The portions of the memory that appear to be susceptible to failure can be taken out of service, with any data stored therein being moved to elsewhere in the memory system. Thus, the system predicts defects before they happen in order to prevent data loss rather than react to a defect after data may have been compromised.

FIG. 7 is a is a flow chart describing one embodiment of a process for performing in field failure prediction using leakage detection. The process of FIG. 7 is performed for the memory system of FIGS. 1-4E (or a different memory system) by and/or at the direction of a control circuit (e.g., including any one or more of control circuitry 110, state machine 112, Controller 122, and/or other control circuit).

In Step 802, X successful program/erase cycles are performed. In one embodiment, five successful program/erase cycles are performed. however, a different number than five can be used. The program/erase cycles are successful because the programming and erasing were both completed without an indication that there was an error. The process of FIG. 7 is performed on one block of memory cells. Therefore, Step 802 includes performing the program/erase cycles on one block. The program/erase cycles are performed by the control circuits described above with respect to FIG. 2.

In response to the X successful program/erase cycles, the system will perform one or more leakage tests on that block. That is, after the block has successfully been programmed and erased X times, the system will use leakage detection circuit 115 to perform one or more leakage tests on the block. As described above, many prior systems used a leakage detection circuit during testing in the manufacturing phase. Step 804 includes using leakage detection circuit 115 in the field (ie during customer use) to test for one or more leakages in response to successful programming of host data.

In step 806, it is determined whether the leakage test identified any leakage. For example, controller 122, state machine 112, or another circuit can determine whether the block of memory has a non-zero amount of leakage that indicates a potential future defect, but not a current defect. If it is determined that there is no leakage, then the process of FIG. 7 loops back to step 802 and the system will continue programming and erasing for that particular block.

If the system determines that there was a non-zero amount of leakage indicating a potential future defect but not a current defect, such as at least a small minimal amount of leakage indicating future potential for a defect, then controller 122, state machine 112 or other control circuit will treat this block as being defective by moving/copying the data stored in the block to a different block in step 808 and then retiring this block from any further use in step 810. Retiring a block from any further use includes adding the block to a list of blocks that are bad blocks that cannot be used by the system for storing host data.

If, in Step 806, the system determines that the amount of leakage is a larger amount of leakage that indicates a current defect existing in the block, Controller 122 will perform a data recovery process in step 812. If the data cannot be recovered, an error is returned to the host. If the data can be recovered, then that data is copied to a different block in step 808 and the block with the defect is retired from any further use in step 810.

Figure 8:
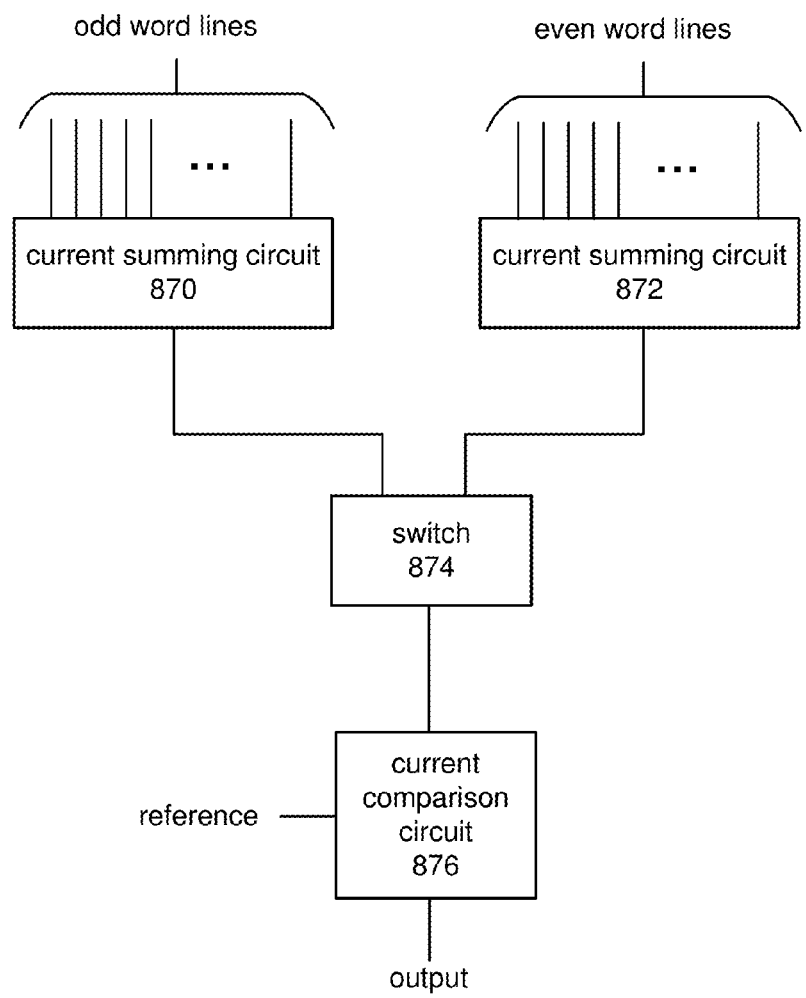
FIG. 8 is a block diagram describing one example of a leakage detection circuit.
Figure 9:
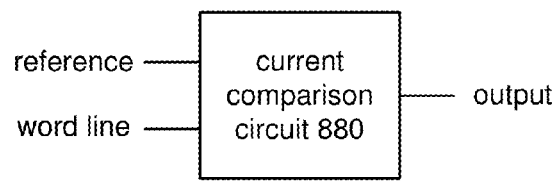
FIG. 9 is a block diagram describing one example of a leakage detection circuit.

Step 804 of FIG. 7 includes one or more leakage tests. In one embodiment, the leakage test is performed by leakage detection circuit 115. FIGS. 8 and 9 provide example embodiments of leakage detection circuit 115. FIG. 8 provides an example of a leakage detection circuit that is used to test for word line to word line leakage. FIG. 9 is an example of leakage detection circuit used to detect word line to substrate leakage. Other types of leakage can also be tested for.

When testing for word line to word line leakage, one embodiment includes dividing the word lines into odd word lines and even word lines, based on the word line numbers (i.e. WL0, WL1, WL2, WL3, . . . , with WL0 being even and WL1 being odd). First, 20 volts (or another high voltage) will be applied to all the even word lines. All the odd word lines will be driven by Vdd (e.g. 2.3 volts) or another small voltage. The system will then monitor the odd word lines to see if there is a larger than expected increase in charge. Subsequently, all the odd word lines will be driven with 20 volts (or another high voltage) while the even word lines are driven with Vdd (or another the low voltage). The even word lines will then be monitored for an unexpected increase in charge. Other divisions of the word lines into groups can also be made. Other types of leakage tests for word line to word line leakage can also be used.

FIG. 8 shows a current summing circuit 870 connected to the odd word lines, for summing the current for all the odd word lines of the block being tested. Current summing circuit 872 connected to the even word lines for a block and creates a sum of the current through all the even word lines. The output of current summing circuit 870 and the output of current summing circuit 872 are provided to a switch 874 which chooses one of the outputs to send to current comparison circuit 876. Current comparison circuit 876 compare a reference current to its input, which is either the sum of the current of the odd word lines or the sum of the current of the even word lines. The reference current is an example current what would be expected if there was no leakage. In one embodiment, current comparison circuit includes a current mirror. Current comparison circuit 876 compare the sum of the current of the odd word lines or the sum of the current of the even word lines to the reference and determine whether the sum of the current of the odd word lines or the sum of the current of the even word lines are within $\Delta$ of the reference current. The "output" of current comparison circuit 876 is zero if the sum of the current of the word lines being tested is within $\Delta$ of the referenced current. If the sum of the current of word lines being tested is not within $\Delta$ of the referenced current, then the output" of current comparison circuit 876 is equal to:

$$\text{output} = (\text{SUM} - \text{REF}) - \Delta,$$

where
SUM=the sum of the current of word lines being tested
REF=reference current In the above discussion with respect to FIG. 8, a high voltage is applied to the word lines in order to detect leakage issues. Application of this high voltages (~20 v) can be referred to as a High Stress Test. Another embodiment includes using lower voltages as another type of leakage detection test, with the applied word line voltages in order of magnitude similar to a read operation (~6 volts). This leakage detection test with the lower voltages can be referred to as a Low Stress Test. In one example implementation, the Low Stress Test could be performed every program/erase cycle, with minimal or no endurance penalty, but probably with lower sensitivity of the High Stress Test. Another embodiment includes using a combination of the High Stress Test every X program/erase cycles and the Low Stress Test every program/erase cycle. If some growing defect is developing very slow, then the High Stress Test should catch it. However, if a growing defect is developing fast, meaning during the X Frog-Erase operations that are not covered by High Stress test, then the Low Stress test may catch it.

FIG. 9 is a block diagram describing one embodiment of leakage detection circuit 115 used to determine word line to substrate (or word line to memory hole) leakage. In this embodiment, one word line at a time is tested by driving that word line to a high voltage (e.g. 20 volts). The word line is connected to current comparison circuit 880 at the connection labeled "word line." Current comparison circuit 880 also receives a "reference" current which represents the amount of current expected if there is no leakage problem. In one embodiment, the substrate (or memory hole) for the memory system is connected to ground. If there is a word line to substrate (or memory hole) leak/short, then a current will flow in the word line as charge is leaked toward ground. The word line current is compared to the reference current to determine if the word line current is within $\Delta$ of the referenced current. If so, the "output" of the current comparison circuit 880 is zero. If the word line current is greater than the reference current by more than $\Delta$, then the output of current comparison circuit 880 is equal to: output=(word line−reference)−$\Delta$. In one embodiment, $\Delta$=250 nano amps.

Figure 10:
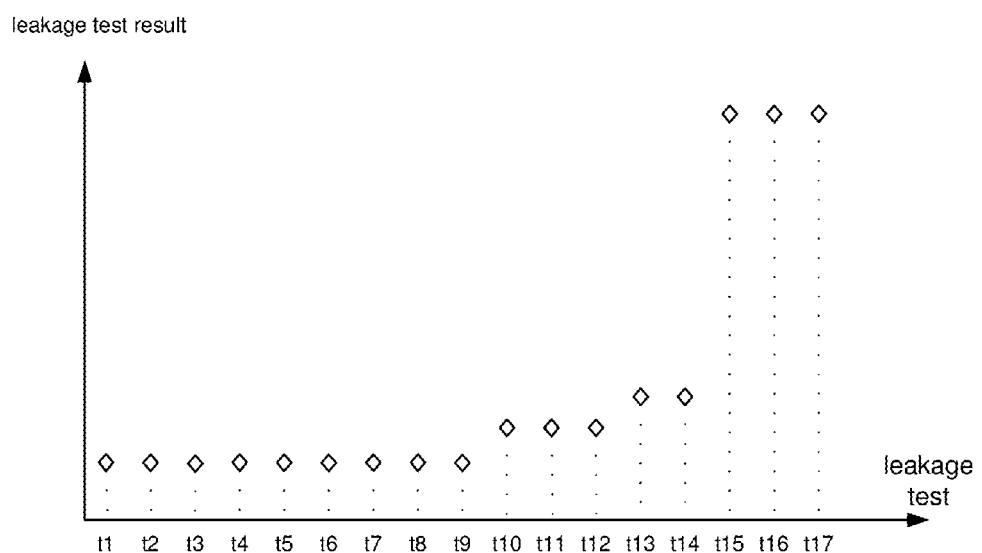
FIG. 10 is a graph depicting the results of testing for leakage.

Looking back at FIG. 7, the system determines whether there is no leak, a small leak (at least a minimum amount) indicating a future potential for defect, or a larger leak indicating a current defect. This is depicted by the graph of FIG. 10. That is, FIG. 10 depicts the results of performing a leakage test 17 times (e.g., performing step 804 17 times). The x axis, labeled t1-t17 represents each of the 17 leakage tests. The y axis indicates the output of the leakage detection circuit. Each of the data points are represented by a diamond. For the first nine tests (t1-t9) the output was either zero or an extremely small number. The output of the leakage detection circuit was greater in test t10, t11 and t12, which represent at least a minimum amount of leakage. The leakage then increases for tests t13 and t14. The amount of leakage was significantly higher for tests t15-t17. The results are higher in test t15 because at this point the block being tested has a defect. It is possible that any data stored in that block is corrupted. Reacting after t15 may be difficult or impossible. Therefore, it is better to utilize the indications of t10 as a prediction of a future defect. Thus, at the time of t10, there is at least a minimum amount of leakage detected, however, not enough to prove that there is a defect present. But there is enough leakage to predict that there will be a future defect. Therefore, the system looks to move the data before the defect occurs and while the data is not corrupted. The block will then be retired by taking it out of rotation for future programming.

Figure 11:
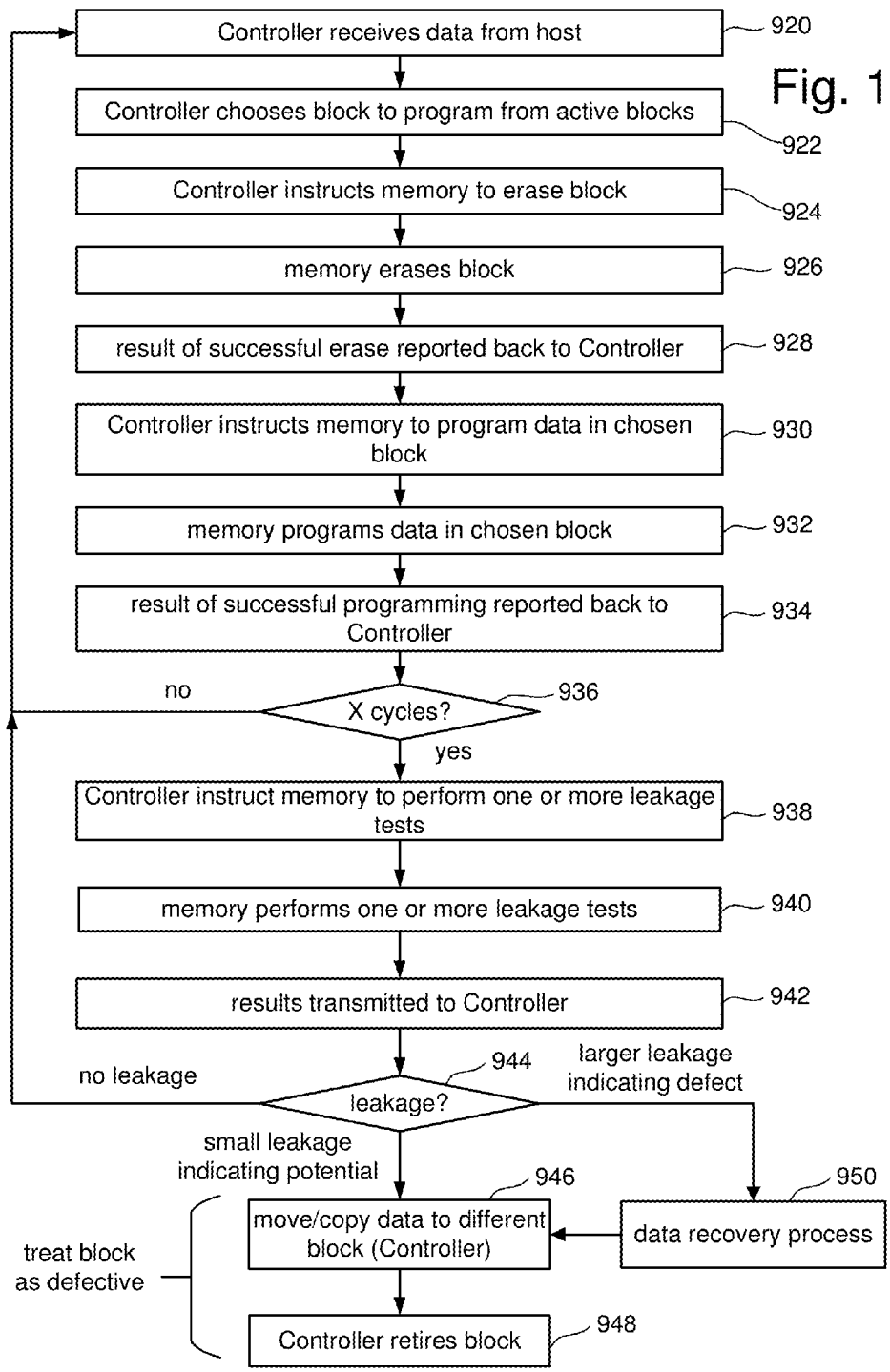
FIG. 11 is a is a flow chart describing one embodiment of a process for performing in field failure prediction using leakage detection.

FIG. 11 is a is a flow chart describing one embodiment of a process for performing in field failure prediction using leakage detection. The process of FIG. 11 is one example implementation of the process of FIG. 7. By the term "in field" it is meant that this process is not performed during a manufacturing process. Rather, the process is performed after the memory system is provided for use with a host. The process of FIG. 11 is performed for the memory system of FIGS. 1-4E (or a different memory system) by Controller 122 and the various components of memory die 108 depicted in FIG. 2.

In Step 920 of FIG. 11, Controller 122 receives data from a host. Controller 122 will also receive an instruction from the host to program that data. In step 922, Controller 122 chooses which block to program the data in from a list of active blocks. That is, Controller 122 keeps a list of blocks that it is allowed to program and a list of blocks that can no longer be used for programming because they are bad blocks due to defects or other reasons. In step 924, Controller 122 instructs memory 108 to erase the block it chose in step 922. That instruction is sent to memory die 108 to be carried out by state machine 112 on the chosen block in memory 126. Thus, in step 926, the memory system will erase the block chosen by the controller. In step 928, the result of successful erase process is reported back to Controller 122. In step 930, Controller 122 instructs memory die 108 to program data in that chosen block. For example, the instructions provided to memory die 108 are to be acted on by state machine 112 in order to program the chosen block in step 932. In step 934, the result of the successful programming is reported back to Controller 122.

In Step 936, Controller 122 determines whether there have been X program/erase cycles. If not, the process moves back to Step 920. If there have been X program/erase cycles, then in response to the most recent successful programming of host data while in the field (and the successful programming in all the previous X program/erase cycles), Controller 122 instructs memory die 108 to perform one or more leakage tests in step 938. That is, Controller 122 sends an instruction to memory die 108 to have leakage detection circuit 115 perform one or more leakage tests, as discussed above. In one embodiment, the instruction from Controller 122 is acted upon by state machine 112 to direct leakage detection circuit 115 to perform the leakage test in step 940. In Step 942, the results of the leakage test are transmitted to controller 122 from memory die 108.

In Step 944, Controller 122 determines whether there was no leakage, a small amount of leakage indicating a potential for defect but no actual current defect or a larger amount of leakage indicating a current defect. If there is no leakage, then the process loops back to step 920. If, in Step 944, Controller 122 determines that there was at least a minimum amount (ie a non-zero amount) of leakage that is small enough to indicate a potential for a defect in the future but not large enough to indicate a current defect (therefore there is no current defect), then Controller 122 will treat the block as being defective. In step 946, Controller send instructions to memory die 108, which will be acted on by state machine 112 to move data from the block with a potential defect to a new block. In step 948, controller 122 retire the block with the potential defect by adding the block's address to a list of bad blocks so that it can no longer be used for programming. If, in step 944, Controller 122 determines that the amount of leakage is large enough to indicate a current defect, then in step 950 Controller 122 perform a data recovery process. There are many data recovery processes known in the art that can be used. If the data cannot be recovered, an error message can be provided to the host. If the data can be recovered, then the process continues to step 946 and the recovered data is moved to another block. In step 948, that block which has a current defect is retired from use for any further programming, and added to a list of bad blocks by Controller 122.

The above description provides a means for predicting defects before they happen in order to avoid corruption of data.

One embodiment includes a non-volatile memory system, comprising: a plurality of memory cells and a plurality of control lines arranged as a non-volatile memory structure; and a control circuit in communication with the non-volatile memory structure. The control circuit is configured to cause testing of a first portion of the non-volatile memory structure for leakage in response to a successful programming process for the first portion of the non-volatile memory structure. The control circuit is also configured to cause data to be copied from the first portion of the non-volatile memory structure to a second portion of the non-volatile memory structure in response to determining that the first portion of the non-volatile memory structure has at least a minimum amount of leakage based on the testing.

One embodiment includes a non-volatile memory system, comprising a three dimensional memory circuit and a controller connected to the three dimensional memory circuit. The three dimensional memory circuit comprises a substrate, a plurality of memory cells, bit lines and word lines arranged in a three dimensional structure above the substrate, and a leakage detection circuit. The controller is configured to request that the leakage detection circuit perform a leakage test on a portion of the memory circuit. The controller is also configured to treat the portion of the memory circuit as defective in response to receiving a result from the leakage circuit that indicates no defect in the portion of the memory circuit.

One embodiment includes a method for operating a non-volatile memory system, comprising: performing program/erase cycles for the non-volatile memory system; in response to a set of multiple program/erase cycles, testing the non-volatile memory system for leakage; based on the testing, determining whether the non-volatile memory system is experiencing leakage; and copying data from a first portion of the non-volatile memory system experiencing leakage to a second portion of the non-volatile memory system in response to determining that the non-volatile memory system is experiencing leakage.

One embodiment includes a non-volatile memory system, comprising: a three dimensional memory structure comprising a plurality of memory cells, bit lines and word lines; means for testing a first portion of the memory structure for leakage; means for determining whether the first portion of the memory structure has a non-zero amount of leakage that indicates a potential future defect but no current defect based on the testing; and means for retiring the first portion of the memory structure in response to determining that the first portion of the non-volatile memory structure has an amount of leakage that indicates a potential future defect but no current defect. For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory system, comprising:
a plurality of memory cells and a plurality of control lines arranged as a non-volatile memory structure; and
a control circuit in communication with the non-volatile memory structure, the control circuit configured to cause testing of a first portion of the non-volatile memory structure for leakage in response to a successful programming process for the first portion of the non-volatile memory structure, and wherein: the control circuit is configured to cause data to be copied from the first portion of the non-volatile memory structure to a second portion of the non-volatile memory structure in response to determining that the first portion of the non-volatile memory structure has more than a first, non-zero amount of leakage and less than a second amount of leakage based on the testing; and the control circuit is configured to perform a data recovery process on data from the first portion of the non-volatile memory structure in response to determining that the first portion of the non-volatile memory structure has more than the second amount of leakage based on the testing.

2. The non-volatile memory system of claim 1, wherein: the control circuit is configured to cause testing of the first portion of the non-volatile memory structure for leakage in response to a successful programming process and a successful erase process for the first portion of the non-volatile memory structure.

3. The non-volatile memory system of claim 1, wherein: the control circuit is configured to cause testing of the first portion of the non-volatile memory structure for leakage in response to multiple program/erase cycles for the first portion of the non-volatile memory structure, the multiple program/erase cycles include the successful programming process as the last programming process of the multiple program/erase cycles.

4. The non-volatile memory system of claim 1, wherein: the control circuit is configured to cause data to be copied from the first portion of the non-volatile memory structure to a second portion of the non-volatile memory structure and treat the first portion of the non-volatile memory structure as defective in response to determining that the first portion of the non-volatile memory structure has more than the first amount of leakage and less than a second amount of leakage.

5. The non-volatile memory system of claim 1, wherein: the control circuit is configured to cause testing of the first portion of the non-volatile memory structure for leakage in response to the successful programming process that programs host data into the first portion of the non-volatile memory structure.

6. The non-volatile memory system of claim 1, wherein:
the control circuit is configured to cause testing of the first portion of the non-volatile memory structure for leakage by causing a test for word line to word line leakage.

7. The non-volatile memory system of claim 1, wherein:
the control circuit is configured to cause testing of the first portion of the non-volatile memory structure for leakage by causing a test for word line to substrate leakage.

8. The non-volatile memory system of claim 1, wherein:
the control circuit is configured to retire the first portion of the non-volatile memory structure in response to determining that the first portion of the non-volatile memory structure has at the first amount of leakage based on the testing.

9. The non-volatile memory system of claim 1, wherein:
the control circuit includes a controller and a leakage detection circuit;
the memory structure and the leakage detection circuit are on a first integrated circuit; and
the controller is on a second integrated circuit that is connected to the first integrated circuit.

10. The non-volatile memory system of claim 1, wherein:
the non-volatile memory structure is a three dimensional memory structure;
the control lines include bit lines and word lines;
the first portion of the non-volatile memory structure is a first block; and
the second portion of the non-volatile memory structure is a second block.

11. A non-volatile memory system, comprising;
a three dimensional memory circuit, comprising:
    a substrate,
    a plurality of memory cells, bit lines and word lines arranged in a three dimensional structure above the substrate, and
    a leakage detection circuit; and
a controller connected to the three dimensional memory circuit, the controller configured to request that the leakage detection circuit perform a leakage test on a portion of the memory circuit, the controller is configured to treat the portion of the memory circuit as defective in response to receiving a result from the leakage circuit that indicates that the portion of the memory circuit has an amount of leakage above a first, non-zero amount, but less than a second amount that indicates a defect in the portion of the memory circuit.

12. The non-volatile memory system of claim 11, wherein:
the controller configured to request that the leakage detection circuit perform a leakage test on a portion of the memory circuit in response to multiple program/erase cycles for the portion of the memory circuit.

13. The non-volatile memory system of claim 11, wherein:
the controller is configured to treat the portion of the memory circuit as defective in response to determining that the amount of leakage indicates a potential future defect but no current defect.

14. A method for operating a non-volatile memory system, comprising:
performing program/erase cycles for the non-volatile memory system;
in response to a set of multiple program/erase cycles, testing the non-volatile memory system for leakage;
based on the testing, determining whether the non-volatile memory system is experiencing leakage; and
copying data from a first portion of the non-volatile memory system experiencing leakage to a second portion of the non-volatile memory system in response to determining that the non-volatile memory system is experiencing leakage;
a control circuit in communication with the non-volatile memory structure, the control circuit configured to cause testing of a first portion of the non-volatile memory structure for leakage in response to a successful programming process for the first portion of the non-volatile memory structure, and wherein the control circuit is configured to cause data to be copied from the first portion of the non-volatile memory structure to a second portion of the non-volatile memory structure in response to determining that the first portion of the non-volatile memory structure has more than a first, non-zero amount of leakage and less than a second amount of leakage based on the testing.

15. The method of claim 14, wherein:
the program/erase cycles are successful; and
the testing the non-volatile memory system for leakage is performed in response to the successful program/erase cycles.

16. The method of claim 14, wherein the testing is a test for word line to word line leakage.

17. The method of claim 14, wherein the testing is a test for word line to substrate leakage.

18. The method of claim 14, wherein:
the testing the non-volatile memory system for leakage is performed in response to determining that the first portion of the non-volatile memory structure has at the first amount of leakage based on the testing.

19. A non-volatile memory system, comprising;
a three dimensional memory structure comprising a plurality of memory cells, bit lines and word lines;
means for testing a first portion of the memory structure for leakage;
means for determining whether the first portion of the memory structure has a non-zero amount of leakage that indicates a potential future defect but no current defect based on the testing; and
means for retiring the first portion of the memory structure in response to determining that the first portion of the non-volatile memory structure has an amount of leakage in a range that indicates a potential future defect but no current defect.

20. The non-volatile memory system of claim 19, further comprising:
means for performing a successful programming process for programming data into the first portion of the non-volatile memory structure, the means for testing performs the testing of the first portion of the non-volatile memory structure for leakage in response to successfully programming data into the first portion of the non-volatile memory structure.

* * * * *